(12) United States Patent
Yamauchi et al.

(10) Patent No.: US 8,148,659 B2
(45) Date of Patent: Apr. 3, 2012

(54) TOUCH SWITCH STRUCTURE

(75) Inventors: Kazuto Yamauchi, Okazaki (JP);
Sadahiko Tanaka, Okazaki (JP);
Keitaro Takizawa, Okazaki (JP);
Yasunori Murayama, Ichinomiya (JP);
Kouichi Yamanoue, Yokohama (JP)

(73) Assignees: Mitsubishi Jidosha Kogyo Kabushiki Kaisha, Tokyo (JP); Visteon Japan, Ltd., Kanagawa (JP)

( * ) Notice: Subject to any disclaimer, the term of this patent is extended or adjusted under 35 U.S.C. 154(b) by 345 days.

(21) Appl. No.: 12/523,774

(22) PCT Filed: Jan. 29, 2008

(86) PCT No.: PCT/JP2008/051288
§ 371 (c)(1),
(2), (4) Date: Aug. 20, 2009

(87) PCT Pub. No.: WO2008/096639
PCT Pub. Date: Aug. 14, 2008

(65) Prior Publication Data
US 2010/0096248 A1 Apr. 22, 2010

(30) Foreign Application Priority Data
Feb. 6, 2007 (JP) ................. 2007-026812

(51) Int. Cl.
*H03K 17/975* (2006.01)

(52) U.S. Cl. ...................................... 200/600

(58) Field of Classification Search .................. 200/600, 200/310–315; 324/681, 627, 688, 690
See application file for complete search history.

(56) References Cited

U.S. PATENT DOCUMENTS

| | | | | |
|---|---|---|---|---|
| 4,766,368 A | * | 8/1988 | Cox | ............................... 324/688 |
| 7,138,809 B2 | | 11/2006 | Nakamura et al. | |
| 2005/0001633 A1 | | 1/2005 | Okushima et al. | |
| 2005/0264304 A1 | | 12/2005 | Nakamura et al. | |

FOREIGN PATENT DOCUMENTS

| | | | |
|---|---|---|---|
| EP | 1487104 A2 | | 12/2004 |
| EP | 1672475 A2 | | 6/2006 |
| GB | 2002522 A | * | 2/1979 |
| JP | 57-187825 A | | 11/1982 |
| JP | 58-87234 U | | 6/1983 |
| JP | 2005-38739 A | | 2/2005 |

* cited by examiner

*Primary Examiner* — Edwin A. Leon
(74) *Attorney, Agent, or Firm* — Birch, Stewart, Kolasch & Birch, LLP.

(57) ABSTRACT

A touch switch structure is provided that can be preferably used for an automotive instrument panel and can securely prevent misjudgments and incorrect detections with respect to operations on the switch. For that purpose, the touch switch structure comprises a base material 2 made of a nonconductive material; a shield electrode layer 4 made of a conductive material and formed on one surface of the base material 2; a touch detection electrode 3 formed on one surface of the base material 2 at the portion where the shield electrode layer 4 is not formed; and an insulation layer 5 made of a nonconductive material and formed at least between the shield electrode layer 4 and a connection pattern 6 of the touch detection electrode 3.

8 Claims, 2 Drawing Sheets

SEC A-A

TOUCH SWITCH STRUCTURE

TECHNICAL FIELD

The present invention relates to a capacitance-type touch switch structure that senses an approach or a touch of a finger or a hand by a change in capacitance between electrodes. Particularly, it relates to a touch switch structure that can be preferably used for an automotive instrument panel.

BACKGROUND ART

Conventionally, touch switches have been widely known which detect a human body part touching on or approaching to a conductive electrode member and trigger a desired instrument. In such touch switches, the electrode member functions as a capacitance sensor which detects on-off of the touch switch by reading change in impedance (capacitance) of the electrode when a human body touches the electrode.

Examples of such a capacitance type touch switch include: one in which an electrode, a connection pattern (wiring portion), a conductive thin film and the like are formed by spattering in the form of films (for example, refer to Patent Document 1); and one in which an electrode, a connection pattern, a conductive thin film and the like are formed on a base material by screen printing with a conductive ink.

Such touch switches can be used for automotive instrument panels. Specifically, they can be used as automotive switches such as on-off switches of audio systems or air conditioners, and selector switches switching between various modes. In such cases, if the electrode member is formed on a light-transmissible base material, the switch can be light-transmissible itself while the light is lit and thus enhances the viewability thereof, which maintains the usability even in the nighttime.

[Patent Document 1] Japanese Patent Laid-Open Publication (Kokai) No. 2005-38739

DISCLOSURE OF THE INVENTION

Problem to be Solved by the Invention

However, when such conventional touch switches are used for automotive instruments just as they are, there are problems such as described below. Namely, when the switch-operating person (operator) wears a glove, it is difficult to sense the operation on the touch switch because the change in electrode impedance is minute then even with a touch of the fingertip to the sensing electrode.

In order to solve that problem, the sensitivity at the sensing electrode can be increased. However, with a simple increase in electrical sensitivity of the detection circuit may cause an incorrect detection, which is a detection of a touch to the switch even when wiring (connection pattern) at the portion other than the sensing electrode is touched. In addition, with such a simple increase in electrical sensitivity of the detection circuit, an adjacent touch switch may reacts, for example when a plurality of touch switches are provided.

The present invention has been made in view of such problems, and the object thereof is to provide a touch switch structure that securely prevents misjudgments and incorrect detections with respect to operations on the switch.

Means for Solving the Problem

The subject matter of the present invention lies in a touch switch structure comprising: a base material made of a nonconductive material; a shield electrode layer made of a conductive material and formed on one surface of the base material; a touch detection electrode formed on one surface of the base material at the portion where the shield electrode layer is not formed; and an insulation layer made of a nonconductive material and formed at least between the shield electrode layer and a connection pattern of the touch detection electrode (claim 1).

In this case, it is preferable that all of the shield electrode layer, the touch detection electrode, and the insulation layer are printed on the base material (claim 2).

Further, it is preferable that the touch detection electrode is connected via the connection pattern to a detection circuit, a high-frequency signal source, and a grounding terminal in the listed order, and the shield electrode layer is connected to the high-frequency signal source (claim 3).

Further, it is preferable that the base material is made of a sheet-shaped resin (claim 4).

Further, it is preferable that the base material is light-transmissible (claim 5).

Advantageous Effect of the Invention

With the touch switch structure of the present invention, it is possible to judge that the switch is touched only when the touch detection electrode is touched, because the capacitance changes only in that case. Therefore, it exhibits an advantageous effect of preventing misjudgments and incorrect detections securely with just a simple structure (claim 1).

In addition, another advantageous effect of remarkable weight reduction and thickness reduction of the touch switch itself can be achieved by forming the shield electrode layer, the touch detection electrode and the insulation layer by printing (claim 2).

Furthermore, still another advantageous effect of preventing misjudgments and incorrect detections securely even at the time of sensitivity increase of the detection circuit can be achieved by connecting the touch detection electrode to a detection circuit, a high-frequency signal source, and a grounding terminal in the listed order, and connecting the shield electrode layer to the high-frequency signal source (claim 3).

Furthermore, advantageous effects of heightening flexibility in the place to which the touch switch can be applied and as well as of enhancing the design of the touch switch can be achieved, because the touch switch can be formed into a complicated, curved form (claim 4).

Furthermore, with a light-transmissible base material, viewability, usability and design can be enhanced (claim 5).

EXPLANATION OF REFERENCE NUMBERS

Figure 1:
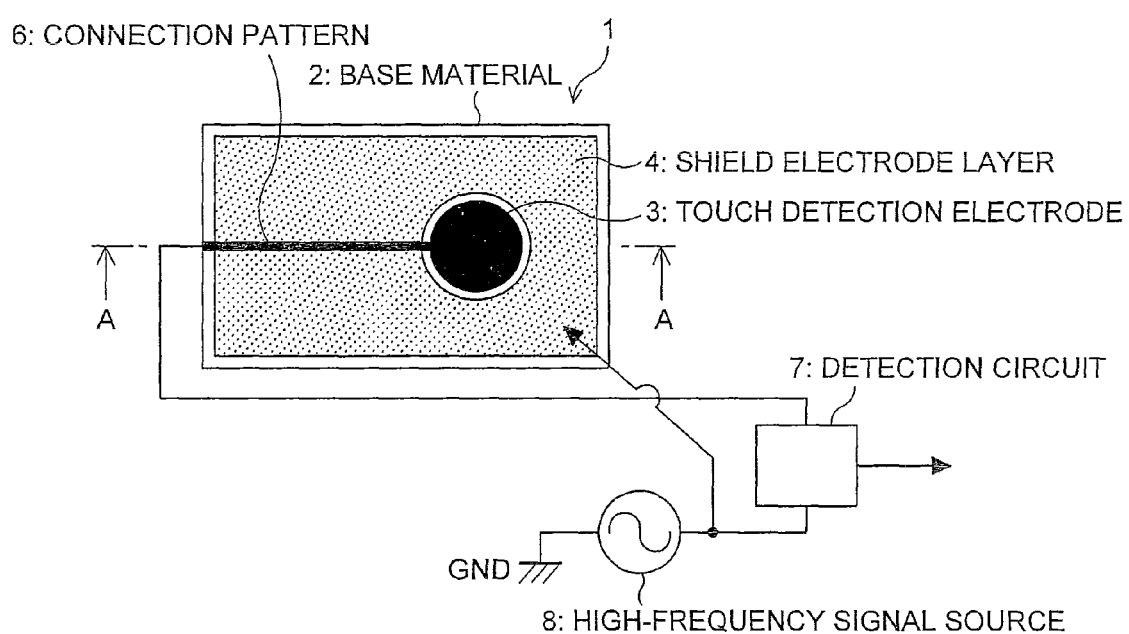
FIG. 1 is a schematic plan view of a touch switch structure according to one embodiment of the present invention.

1 touch switch
2 base material
3 touch detection electrode
4 shield electrode layer
5 insulation layer
6 connection pattern
7 detection circuit
8 high-frequency signal source

BEST MODES FOR CARRYING OUT THE INVENTION

Figure 2:
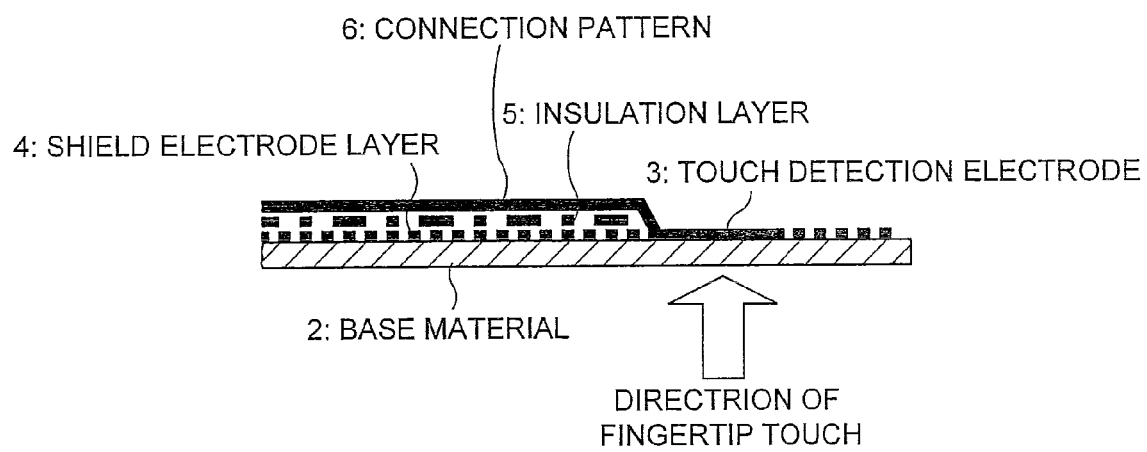
FIG. 2 is a schematic sectional view of a touch switch structure according to one embodiment of the present invention, which illustrates an A-A sectional view of FIG. 1.

In the following, explanation will be given on a touch switch structure according to one embodiment of the present invention with reference to the drawings. FIG. 1 is a schematic plan view of the structure thereof, and FIG. 2 is an A-A sectional view of FIG. 1.

In the present embodiment, the touch switch 1 is provided inside an automobile and applied mainly to an operation panel of an audio system or an air conditioner. Therefore, the base material 2 of the touch switch 1 is formed of a sheet-shaped resin such as polycarbonate or acrylic resin. By forming the base material 2 into thin sheet in this way, the touch switch 1 can be formed into a complicated, curved form.

In addition, forming the base material 2 into thin sheet secures the light-transmission property of the base material 2, which makes it possible to enhance the viewability, usability and design. Namely, when the lights are lit in the nighttime, light from a back-lighting (not shown in the drawings), which is provided on the backside of the base material 2, penetrates the base material 2 just like the touch switch 1 itself emits light. In this way, the design, usability and the like can be improved.

Though the base material 2 is formed of a resin in the present embodiment, the material of which the base material 2 is formed is by no means limited to resins insofar as it is nonconductive.

On the backside (which corresponds to the upper surface side of FIG. 1 and FIG. 2) of this base material 2, there are provided a touch detection electrode (hereinafter abbreviated simply as "sensing electrode") 3, a shield electrode layer 4 and a insulation layer 5. These sensing electrode 3, shield electrode layer 4 and insulation layer 5 are formed on the base material 2 by means of screen printing. Specifically, the sensing electrode 3 and the shield electrode layer 4 are printed on the base material 2 using an ink containing a conductive material. In addition, the insulation layer 5 is printed on the base material 2 using a nonconductive ink.

The shield electrode layer 4 is printed at the portion other than where the sensing electrode 3 is formed, as shown in FIG. 1 and FIG. 2. After the shield electrode layer 4 is formed, the insulation layer 5 is laminated on the shield electrode layer 4. The insulation layer 5 is formed at the portion corresponding to the wiring portion (connection pattern) 6 of the sensing electrode 3 so that the insulation layer 5 is located between the connection pattern 6 and the shield electrode layer 4, as shown in FIG. 2.

The insulation layer 5 may have approximately the same area as the shield electrode layer 4 and be formed so that it covers the entire upper surface of the shield electrode layer 4.

On the portion of the base material 2 where the shield electrode layer 4 is not formed, the sensing electrode 3 is formed by coating. Also, the connection pattern 6 is formed on the insulation layer 5. Between the shield electrode layer 4 and the sensing electrode 3, a gap is formed, as shown in FIG. 1, which prevents direct contact of the shield electrode layer 4 with the sensing electrode 3.

In the result, as shown in FIG. 2, at the position where the connection pattern 6 is disposed, the connection pattern 6, the insulation layer 5, the shield electrode layer 4 and the base material 2 are laminated in the listed order, at the portion where the sensing electrode 3 is disposed, the sensing electrode 3 and the base material 2 are laminated in the listed order, and at the portion where neither the connection pattern 6 nor the sensing electrode 3 is disposed, the shield electrode layer 4 and the base material 2 are laminated in the listed order.

In addition, as shown in FIG. 1, the sensing electrode 3 is connected to a known detection circuit 7 via the connection pattern 6. Between the detection circuit 7 and the grounding terminal GND, a high-frequency signal source 8 is connected.

On the other hand, the shield electrode layer 4 is connected between the detection circuit 7 and the high-frequency signal source 8.

Therefore, when a fingertip or the like of the switch-operating person (operator) approaches to the base material 2 from the direction of the arrow in FIG. 2 and the fingertip touches on the sensing electrode 3, the touch of the operator can be sensed by detecting the change in impedance (change in capacitance) between the detection circuit 7 and the sensing electrode 3, as is the case with the conventional touch switches.

Incidentally, in the present embodiment, the electrical sensitivity of the detection circuit 7 is increased in order to detect the operation on the touch switch 1 securely even when the operator wears a grove. In such a case, conventional touch switches may misjudge a touch on a portion other than the sensing electrode 3, for example on the shield electrode layer 4, as a touch on the sensing electrode 3, by reading a slight change in impedance caused between the sensing electrode 3 and the detection circuit 7. However, in the present embodiment, the direct connection between the shield electrode layer 4 and the high-frequency signal source 8 inhibits change in impedance between the sensing electrode 3 and the detection circuit 7, which makes it possible to prevent the incorrect detection.

When the connection pattern 6 is touched, with the electrical sensitivity set at a normal value, no touch is sensed and therefore no misjudgment is made usually, because very little change in impedance is caused by the presence of the insulation layer 5. However, in the present embodiment, the electrical sensitivity of the detection circuit 7 is increased as described above on the assumption that the operator would wear a glove, and therefore, with a conventional touch switch, a misjudgment may be made because a minute change in impedance may be detected even with just the insulation layer 5. However, in the present embodiment, the shield electrode layer 4 interposed between the insulation layer 5 and the base material 2 can inhibit change in impedance between the sensing electrode 3 and the detection circuit 7, even when a slight impedance change is detected. Namely, even when the sensitivity of the detection circuit 7 is increased, misjudgments of a touch on the connection pattern 6 as a detection of a touch (on the sensing electrode 3) can be prevented securely.

With the above-mentioned construction, the touch switch structure according to one embodiment of the present invention exhibits an advantageous effect of preventing misjudgments and incorrect detections securely during the operation of the touch switch 1 with just a simple structure. Namely, when the fingertip or the like of an operator touches on the sensing electrode 3, that touch of the operator can be sensed by detecting the change in impedance (change in capacitance) between the detection circuit 7 and the sensing electrode 3, as is the case with the conventional touch switches.

In addition, when the shield electrode layer 4 or the connection pattern 6 is touched, the direct connection between the shield electrode layer 4 and the high-frequency signal source 8 inhibits change in impedance between the sensing electrode 3 and the detection circuit 7, which makes it possible to prevent the incorrect detection.

Furthermore, because the sensing electrode 3 is connected via the connection pattern 6 to the detection circuit 7, the high-frequency signal source 8, and the grounding terminal GND in the listed order and the shield electrode layer 4 is directly connected to the high-frequency signal source 8, misjudgments and incorrect detections can be prevented securely even when the sensitivity of the detection circuit 7 is increased.

In addition, because all of the touch detection electrode 3, shield electrode layer 4 and insulation layer 5 are formed on the base material 2 by printing (screen printing), another advantageous effect of remarkable weight reduction and thickness reduction of the touch switch 1 itself can be achieved. Furthermore, because the base material 2 is made of a sheet-shaped resin, and therefore, the touch switch 1 can be formed into a complicated, curved form, advantageous effects of heightening flexibility in the place to which the touch switch 1 can be applied and as well as of enhancing the design of the touch switch can be achieved.

Furthermore, because the base material 2 is light-transmissible, viewability and usability when lights are lit in the nighttime, as well as design can be enhanced, by providing a back-lighting or the like on the backside of the touch switch 1.

The present invention is by no means limited to the above-mentioned embodiment, but various modifications can be added thereto insofar as they do not depart from the scope of the present invention. For example, though an example in which the touch switch is used inside an automobile was described in the above-mentioned embodiment, there is no limitation on where to use the touch switch. Moreover, though all of the sensing electrode 3, shield electrode layer 4 and insulation layer 5 are formed by means of screen printing in the above-mentioned embodiment, these can be formed into films by spattering.

The invention claimed is:

1. A touch switch structure comprising;
 a base material made of a nonconductive material;
 a shield electrode layer made of a conductive material and formed on one surface of said base material;
 a touch detection electrode that detects a touch operation on a backside of the said surface of said base material and that is formed on said one surface of said base material at the portion where said shield electrode layer is not formed;
 an insulation layer made of a nonconductive material and formed on said shield electrode layer; and
 a connection pattern that connects between said touch detection electrode and a detection circuit and that is formed on said insulation layer, wherein
 said insulation layer is formed at least between said shield electrode layer and said connection pattern.

2. The touch switch structure according to claim 1, wherein all of said shield electrode layer, said touch detection electrode, and said insulation layer are printed on said base material.

3. The touch switch structure according to claim 1, wherein said touch detection electrode is connected via said connection pattern to the detection circuit, a high-frequency signal source, and a grounding terminal in the listed order, and
 said shield electrode layer is connected to said high-frequency signal source.

4. The touch switch structure according to claim 3, wherein said base material is made of a sheet-shaped resin.

5. The touch switch structure according to claim 4, wherein said base material is light-transmissible.

6. The touch switch structure according to claim 2, wherein said touch detection electrode is connected via said connection pattern to the detection circuit, a high-frequency signal source, and a grounding terminal in the listed order, and
 said shield electrode layer is connected to said high-frequency signal source.

7. The touch switch structure according to claim 6, wherein said base material is made of a sheet-shaped resin.

8. The touch switch structure according to claim 7, wherein said base material is light-transmissible.

* * * * *